(12) United States Patent
Yang et al.

(10) Patent No.: US 7,173,243 B1
(45) Date of Patent: Feb. 6, 2007

(54) NON-FEATURE-DEPENDENT FOCUSING

(75) Inventors: Hedong Yang, Santa Clara, CA (US); Amir Azordegan, Santa Clara, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 19 days.

(21) Appl. No.: 11/020,586

(22) Filed: Dec. 22, 2004

Related U.S. Application Data

(60) Provisional application No. 60/633,983, filed on Dec. 7, 2004.

(51) Int. Cl.
*G01R 31/305* (2006.01)
(52) U.S. Cl. ..................................................... 250/307
(58) Field of Classification Search ................. 250/307
See application file for complete search history.

(56) References Cited

U.S. PATENT DOCUMENTS

| | | | |
|---|---|---|---|
| 5,130,540 A | * | 7/1992 | Yamada et al. ............. 250/310 |
| 6,025,600 A | | 2/2000 | Archie et al. |
| 6,753,518 B2 | | 6/2004 | Watanabe et al. |

* cited by examiner

*Primary Examiner*—David A. Vanore
(74) *Attorney, Agent, or Firm*—Okamoto & Benedicto LLP

(57) ABSTRACT

One embodiment disclosed relates to an automated process for focusing a charged-particle beam in an apparatus onto an area of a substrate. A focusing parameter of the apparatus is set to a value, and intensity data is acquired from the area. The foregoing setting and acquiring steps are repeated for a range of values for the focusing parameter. A focusing sharpness measure is computed for each value of the focusing parameter based on noise in the acquired intensity data, and an in-focus value is determined for the focusing parameter based on the computed focusing sharpness measures. The focusing parameter of the apparatus may be, for example, an objective lens current, or a substrate bias voltage. The computation of the noise-based focusing sharpness measure may involve generating shifted or interleaved signals and calculating correlations between these signals. The focusing may be advantageously performed on an area lacking substantial edge information.

6 Claims, 5 Drawing Sheets

NON-FEATURE-DEPENDENT FOCUSING

CROSS-REFERENCE TO RELATED APPLICATIONS

The present invention claims the benefit of U.S. Provisional Patent Application No. 60/633,983, entitled "Non-Feature-Dependent Focusing," filed Dec. 7, 2004 by inventors Hedong Yang and Amir Azordegan, the disclosure of which is hereby incorporated by reference.

BACKGROUND OF THE INVENTION

1. Field of the Invention

The present invention relates to charged-particle beam systems, including those used for inspection or review of substrates, such as semiconductor wafers and masks.

2. Description of the Background Art

Charged-particle beam systems include electron beam (e-beam) systems, such as scanning electron microscopes (SEMs) and other e-beam instruments. In one application, these systems may be used for inspection and review of substrates, such as semiconductor wafers.

In a typical application of a charged-particle beam system (such as, for example, an SEM), the ability to focus the particle beam into a small spot onto the surface of a specimen is critical to obtaining sharp images or scan profiles of the specimen with a high degree of resolution. The ability to focus thus translates into measurement accuracy and measurement precision.

FIG. 1 is a flow chart of a conventional focusing method 100 for a charged-particle beam system. In the conventional technique, the charged-particle beam is targeted (102) at areas on the specimen that contain topologically varying structures or features (such as, for example, lines, trenches, holes, post or defects). A set of specimen images or scan profiles are acquired (104) from these targeted areas by sweeping through the current settings of the objective lens of the system or the bias voltages applied to the specimen. Changing either the objective lens current or specimen bias voltage through several steps effectively changes the focal point of the beam to a different height at each step. A sharpness measure of the image or profile at each lens current or bias voltage setting is then computed (106) to generate (108) a sharpness curve. Typically, the sharpness measure may be computed (106) using a square (or magnitude) of a first (or second) derivative of the image or profile signal. A best focus condition is determined (110) from the maximum of the sharpness curve. In other words, the lens current or bias voltage value at that maximum is the setting at which the image or scan profile is best focused.

The computation of the sharpness measure typically involves filtering (105) the image or scan profile through a band-pass filter. The pass band of the filter is set such that only the signal energy associated with a selected spatial frequency range is extracted and used to derive the sharpness measure. The pass band typically selects a middle range of spatial frequencies that efficiently represent the edge information embodied in the physical features and therefore is most sensitive to a change in focus. The data from the lower spatial frequency range represents relatively flat or slowly varying features that are relatively insensitive to a change in focus. The data from the higher spatial frequency range may be dominated by noise. These lower frequency data and higher frequency data are conventionally discarded.

Unfortunately, the above-discussed conventional focusing technique has drawbacks and limitations. These drawbacks and limitations are discussed below.

It is desirable to improve charged-particle beam systems, including those utilized for the automated inspection or review of substrate surfaces. More particularly, it is desirable to improve focusing capabilities of charged-particle beam systems.

SUMMARY

One embodiment of the invention relates to an automated process for focusing charged-particle beam in an apparatus onto an area of a substrate. A focusing parameter of the apparatus is set to a value, and the reflected particles from the illuminated area are collected and form the intensity data. The foregoing setting and acquiring steps are repeated for a range of values for the focusing parameter. A focusing sharpness measure is computed for each value of the focusing parameter based on noise in the acquired intensity data, and an in-focus value is determined for the focusing parameter based on the computed focusing sharpness measures.

The focusing parameter of the apparatus may be, for example, an objective lens current, or a substrate bias voltage. The computation of the noise-based focusing sharpness measure may involve generating shifted or interleaved signals and calculating correlations (or covariances) between these signals. The focusing may be advantageously performed on an area lacking substantial edge information.

Other embodiments are also disclosed.

DETAILED DESCRIPTION

As described above, the conventional focusing methods for charged-particle beam systems, such as SEMs, require that the signals (scans or images) be collected during a focus sweep (where a range of objective lens currents or substrate bias voltages are stepped through) come from areas where features exist that can be focused upon. These features may include, for example, lines, trenches, contacts or posts. The sharpness of the feature edges embedded in the signals at each sweep setting is analyzed to obtain a sharpness measure curve with a clear maximum. The best focus is determined as the lens current or substrate bias setting that corresponds to the maximum in the sharpness measure curve. Hence, central to these methods, features with edge structure must be present in order to generate a sharpness curve having a maximum.

The conventional focusing methods have various disadvantages. First, during the focus sweep, an excessive particle dose may be put into the features that are to be inspected on a specimen.

Second, in an automated operation mode, the system may be started from a state where there is no feature within the field of view and where the beam is out of focus. In such a state, the conventional system may have difficulty navigating to the intended target area to perform the focus sweep because it cannot properly identify the target area without a clear image. Yet, at the same time, it may not be able to perform the focusing method to obtain clear images because the focusing method requires the features to focus on. As a result, the system may have to go through the focus sweep at one or more blindly chosen location. This may negatively impact the throughput and disadvantageously put more charge onto the specimen.

Third, the bandwidth parameters of the bandpass filter used to form the sharpness curve requires tuning, either manually or automatically, to the width of the edges. As discussed above, the bandpass filter is used to extract the feature edge signal from the set of image data or scan profiles acquired through the focus sweep prior to formation of the sharpness curve. Without such tuning of the bandpass filter, the accuracy of the focusing may decrease.

In contrast to the above-discussed conventional focusing methods, applicants believe that the present invention provides a focusing technique for a charged-particle beam system using a distinctive and novel principle. Applicants believe that the focusing technique disclosed herein comprises non-feature-dependent focusing technique in that it does not require or necessarily depend on edge features in the area being focused on.

While the conventional focusing technique treats the high-frequency noise as a problem and filters it out, the technique disclosed herein utilizes the noise contained in the signals to determine the best focus. As a result, the acquired images or scan profiles during a focus sweep are no longer required to come from a specimen area where edge features exist.

Figure 1:
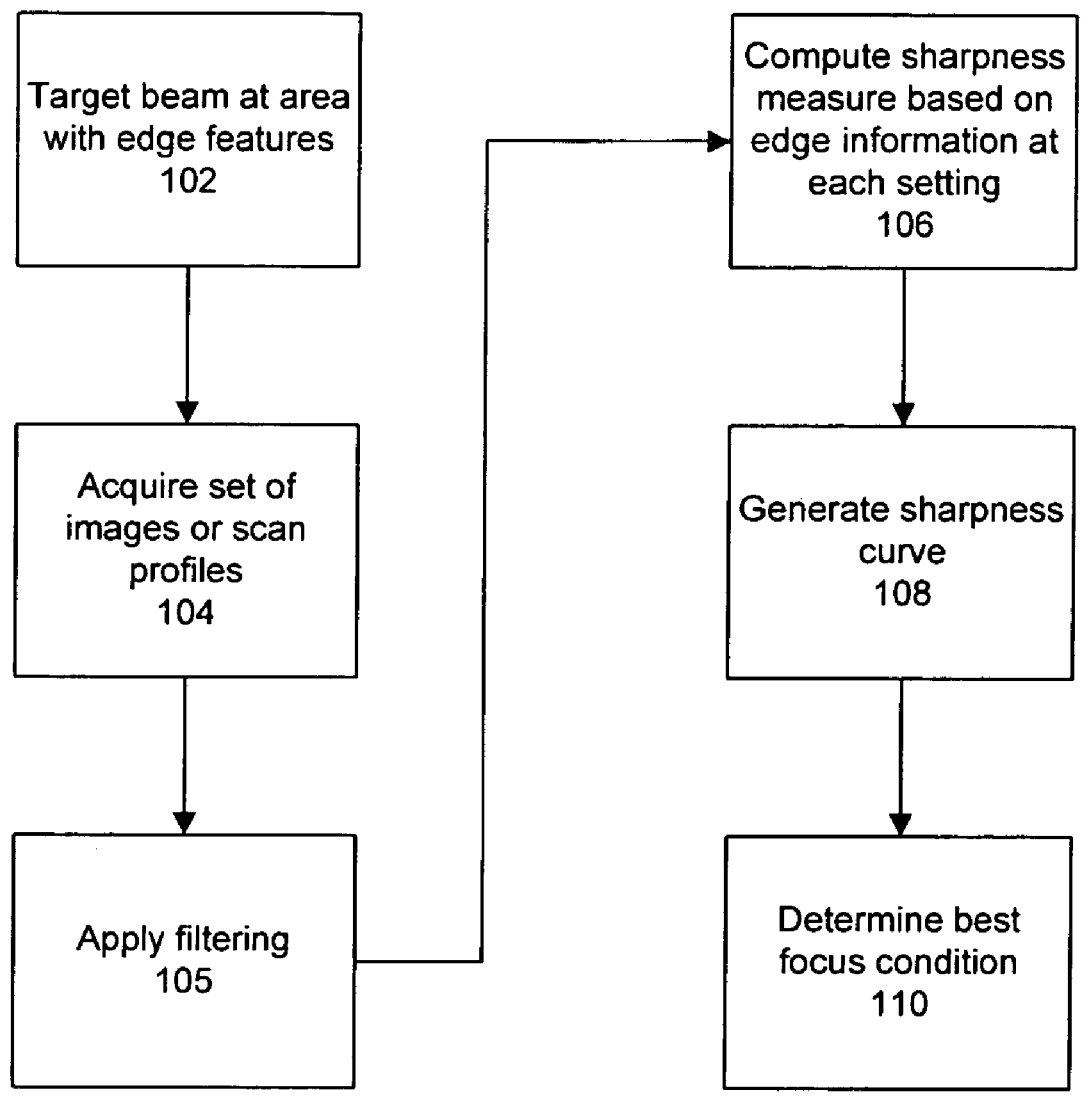
FIG. 1 is a flow chart of a conventional focusing method for a charged-particle beam system.
Figure 2:
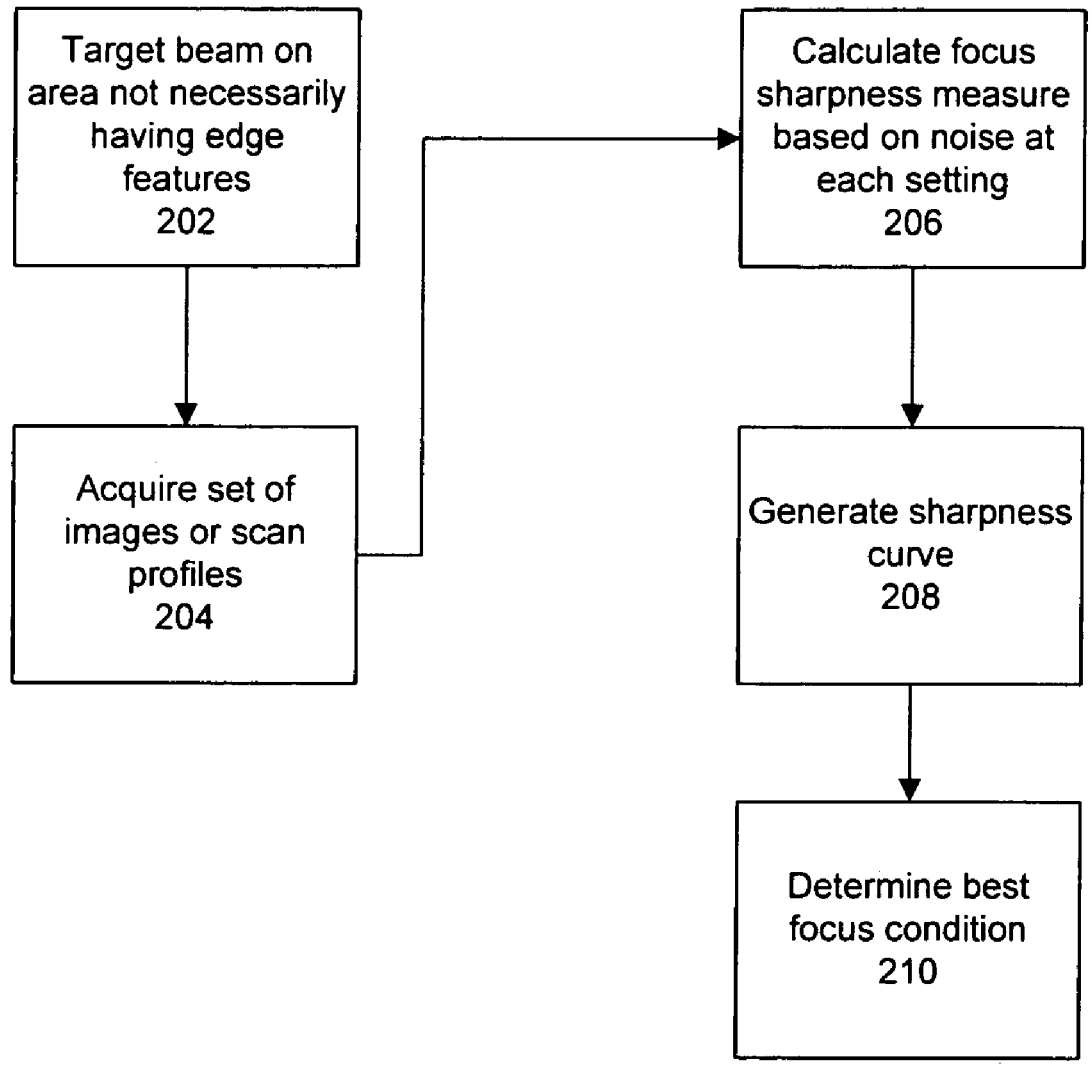
FIG. 2 is a flow chart of a focusing method for a charged-particle beam system in accordance with an embodiment of the invention.

FIG. 2 is a flow chart of a focusing method 200 for a charged-particle beam system in accordance with an embodiment of the invention. In this method 200, the target beam may be on an area not necessarily having edge features (202). This contrasts with the conventional focusing method 100, where the beam must be targeted at areas on the specimen that contain topologically varying structures or features (such as, for example, lines, trenches, holes, post or defects) (102). Hence, the focusing method 200 disclosed herein is advantageously non-feature-dependent.

From the area (which may or may not have edge features), a set of images or scan profiles are acquired (204). The acquired intensity data may be either two-dimensional (image data) or one-dimensional (scan profile). From the acquired data, a focus sharpness measure is calculated for each focus setting (206). As discussed further below in relation to FIG. 3, the calculated sharpness measure may be thought of as being based on the noise in the acquired signal.

Figure 4:
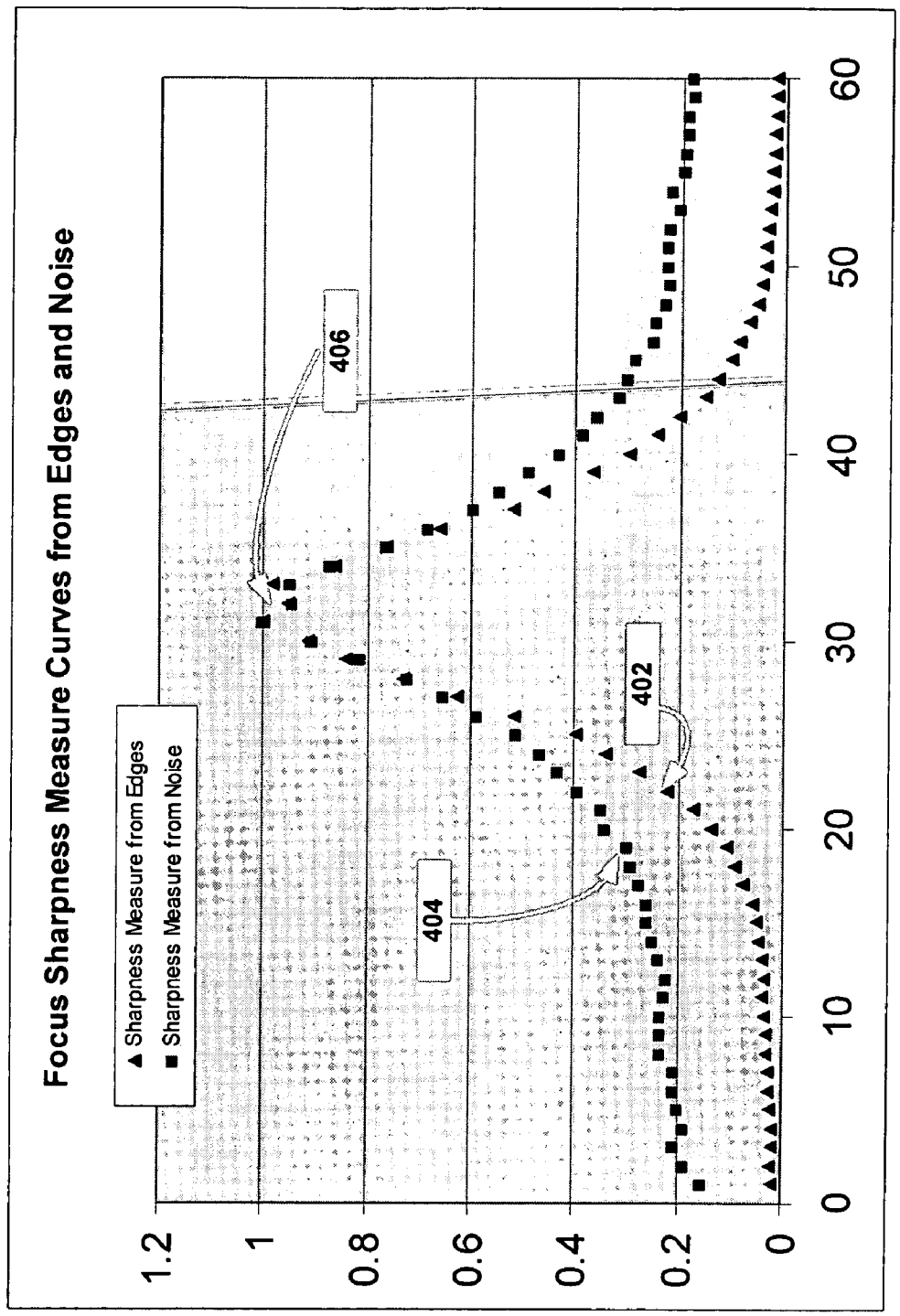
FIG. 4 is a graph of results demonstrating the accuracy of the focusing method disclosed herein in comparison to a conventional focusing method as applied to a sample substrate.

A sharpness measure curve is generated (208) from the calculated sharpness measures. From a maximal value in the sharpness measure curve, a best focus condition or setting may be determined (210). An example sharpness measure curve 404 that is generated based on the noise is shown in FIG. 4 and is discussed further below.

Figure 3:
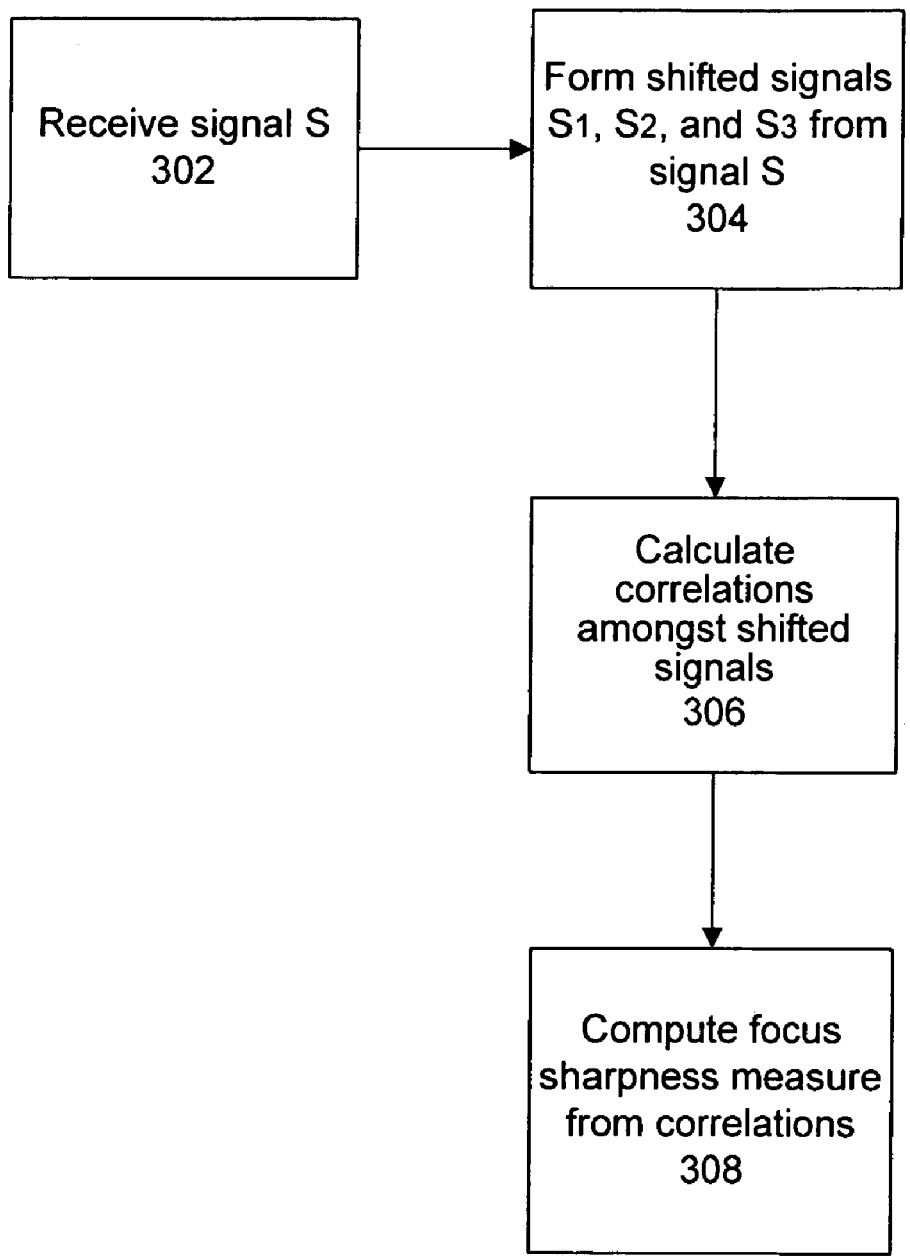
FIG. 3 is a flow chart of a procedure to calculate a focus sharpness measure in accordance with a first embodiment of the invention.

FIG. 3 is a flow chart of a procedure 300 to calculate a focus sharpness measure in accordance with a first embodiment of the invention. For ease of explanation, the procedure 300 is discussed in relation to a one-dimensional scan profile signal. In other embodiments, the procedure 300 may be applied to two-dimensional image data, instead of one-dimensional scan profile data.

The signal S is first received (302). In an exemplary embodiment, the signal S comes from a single line scan across the area to be focused. In this case, S(i), where i=1 to N, N being the number of pixels in the signal S.

In this exemplary procedure 300, three shifted signals $S_1$, $S_2$, and $S_3$ are formed or generated (304) from the signal S. These shifted signals each have N−2 pixels and are defined as specified below.

$$S_1 = S(i), i=1, \ldots N-2 \qquad \text{(Equation 1.1)}$$

$$S_2 = S(i), i=2, \ldots N-1 \qquad \text{(Equation 1.2)}$$

$$S_3 = S(i), i=3, \ldots N \qquad \text{(Equation 1.3)}$$

From these shifted signals, $S_1$, $S_2$, and $S_3$, the correlations (covariances) $C_{S1S1}$, $C_{S2S2}$, $C_{S3S3}$, $C_{S1S2}$, $C_{S2S3}$ and $C_{S3S1}$ are calculated (306). These correlations may be calculated as specified by the equations below.

$$C_{uv} = \frac{1}{N} \sum_{i=1}^{N} (u_i - \bar{u})(v_i - \bar{v}) \qquad \text{(Equation 2.1)}$$

where $$\bar{u} = \frac{1}{N} \sum_{i=1}^{N} u_i \qquad \text{(Equation 2.2)}$$

and $$\bar{v} = \frac{1}{N} \sum_{i=1}^{N} v_i \qquad \text{(Equation 2.3)}$$

For $C_{S1S1}$, $u=v=S_1$ and $u_i=v_i=S_1(i)$. For $C_{S2S2}$, $u=v=S_2$ and $u_i=v_i=S_2(i)$. For $C_{S3S3}$, $u=v=S_3$ and $u_i=v_i=S_3(i)$. For $C_{S1S2}$, $u=S_1$, $v=S_2$, $u_i=S_1(i)$, and $v_i=S_2(i)$. For $C_{S2S3}$, $u=S_2$, $v=S_3$, $u_i=S_2(i)$, and $v_i=S_3(i)$. For $C_{S3S1}$, $u=S_3$, $v=S_1$, $u_i=S_3(i)$, and $v_i=S_1(i)$.

The calculated correlations are then used to compute (308) a noise-based focus sharpness measure $\sigma_{noise}^2$ for that scan S. The noise-based focus sharpness measure may be computed as specified below.

$$\sigma_{noise}^2 = 3\sqrt{C_{S1S1} C_{S2S2} C_{S3S3}} - 3\sqrt{C_{S1S2} C_{S2S3} C_{S1S3}} \qquad \text{(Equation 3)}$$

or similarly $$\sigma_{noise}^2 = \frac{1}{3}(C_{S_1 S_1} + C_{S_2 S_2} + C_{S_3 S_3}) - \frac{1}{3}(C_{S_1 S_2} + C_{S_2 S_3} + C_{S_1 S_3}) \qquad \text{(Equation 4)}$$

FIG. 4 is a graph of results demonstrating the accuracy of the focusing method disclosed herein in comparison to a conventional focusing method as applied to a sample substrate. In FIG. 4, the focusing parameter (for example, lens current or bias voltage) is indicated by the horizontal axis, and the focus sharpness measure is indicated by the vertical axis.

The conventional focusing method 100 uses sharpness measures generated from edge information. These edge-derived sharpness measures generate a first focus sharpness measure curve 402 shown in FIG. 4. As shown, this conventionally-derived curve 402 shows a peak 406 indicating an optimal focusing parameter in the low thirties for this sample.

The focusing method 200 in accordance with an embodiment of the invention uses sharpness measures generated from noise-related information. These noise-derived sharpness measures generate a second focus sharpness measure curve 404 shown in FIG. 4. As shown, this curve 404 also shows a peak 406 indicating an optimal focusing parameter in the low thirties for this sample.

Figure 5:
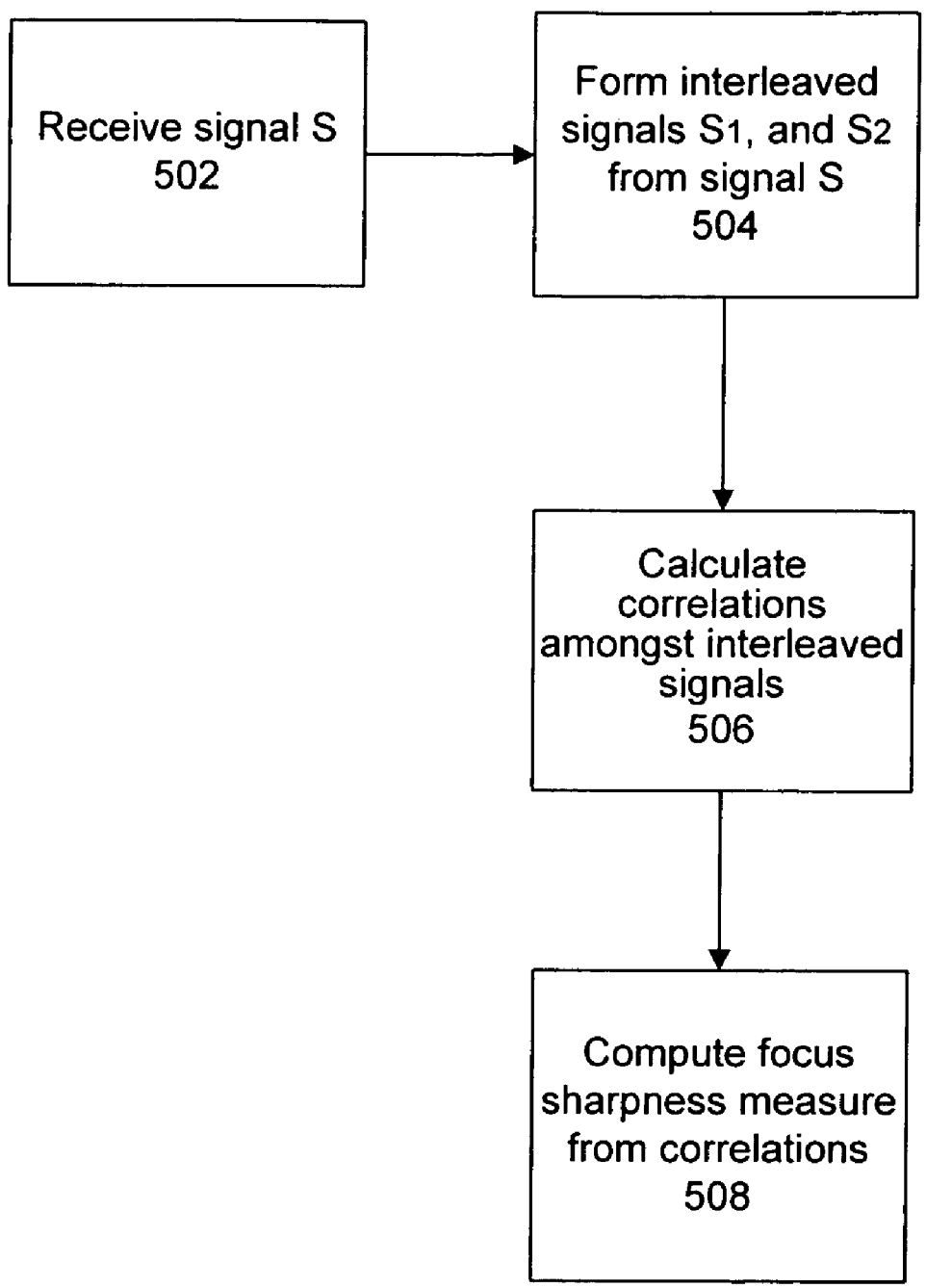
FIG. 5 is a flow chart of a procedure to calculate a focus sharpness measure in accordance with a second embodiment of the invention.

FIG. 5 is a flow chart of a procedure 500 to calculate a focus sharpness measure in accordance with a second embodiment of the invention. The procedure 500 is discussed in relation to a one-dimensional scan profile signal for ease of explanation. In other embodiments, the procedure 500 may be applied to two-dimensional image data, instead of one-dimensional scan profile data.

The signal S is first received (502). In an exemplary embodiment, the signal S comes from a single line scan across the area to be focused. In this case, S(i), where i=1 to N, N being the number of pixels in the signal S.

In this exemplary procedure 500, two interleaved signals $S_1$ and $S_2$ are formed or generated (504) from the signal S. These interleaved signals each have N/2 pixels and are defined as specified below.

$$S_1 = S(2i-1), i=1, \ldots N/2 \quad \text{(Equation 5.1)}$$

$$S_2 = S(2i), i=1, \ldots N/2 \quad \text{(Equation 5.2)}$$

As seen from Equations 5.1 and 5.2, $S_1$ comprises odd pixels of the signal S, and $S_2$ comprises even pixels of the signal S.

From these interleaved signals, $S_1$ and $S_2$, the correlations (covariances) $C_{S1S1}$, $C_{S2S2}$, and $C_{S1S2}$ are calculated (506). These correlations may be calculated as specified by Equations 2.1 through 2.3 above, where N is replaced by N/2, and where for $C_{S1S1}$, $u=v=S_1$ and $u_i=v_i=S_1(i)$, for $C_{S2S2}$, $u=v=S_2$ and $u_i=v_i=S_2(i)$, and for $C_{S1S2}$, $u=S_1$, $v=S_2$, $u_i=S_1(i)$, and $v_i=S_2(i)$.

The calculated correlations are then used to compute (508) a noise-based focus sharpness measure $\sigma_{noise}^2$ for that scan S. The noise-based focus sharpness measure may be computed as specified below.

$$\sigma_{noise}^2 = \sqrt{C_{S1S1} C_{S2S2}} - C_{S1S2} \quad \text{(Equation 6)}$$

or similarly $$\sigma_{noise}^2 = \frac{1}{2}(C_{S_1 S_1} + C_{S_2 S_2}) - C_{S_1 S_2} \quad \text{(Equation 7)}$$

Advantageously, the above-discussed focusing technique may be applied to focus a beam on an area lacking substantial features or edge information. In contrast, the conventional focusing technique relies on substantial features or edge information on which to focus.

While the conventional technique is edge width dependent, the above-discussed technique is edge width independent. The above-discussed technique may be advantageously applied within review SEMs, where focusing on un-patterned or non-printed wafers is often required.

Furthermore, the above-discussed focusing technique may be implemented such that a lower particle dose is exerted on a specimen. This may advantageously reduce carry-over effects induced by the particle beam from the focusing process to the inspection or measurement results. This may result, for example, in more accurate critical dimension measurements. With the lower doses imposed by the above-discussed focusing technique, this technique may be well suited for focusing on dose-sensitive materials, such as photoresist.

The above-described diagrams are not necessarily to scale and are intended be illustrative and not limiting to a particular implementation. The above-described invention may be used in an automatic inspection or review system and applied to the inspection or review of semiconductor substrates, optical or X-ray masks, and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An automated process for focusing a charged-particle beam in an apparatus onto an area of a substrate, the process comprising:

setting a focusing parameter of the apparatus to a value;

acquiring intensity data from the area;

repeating the setting and acquiring steps for a range of values for the focusing parameter;

computing a focusing sharpness measure for each value of the focusing parameter based on the acquired intensity data; and determining an in-focus value for the focusing parameter based on the computed focusing sharpness measures, wherein the focusing parameter corresponds to a substrate bias voltage.

2. The process of claim 1, wherein the in-focus value for the focusing parameter corresponds to an extremal value of the focusing sharpness measure.

3. The process of claim 1, wherein the focusing is performed on an area lacking substantial edge information.

4. The process of claim 1, wherein the charged-particle beam comprises an electron beam.

5. The process of claim 1, wherein the computation of the focusing sharpness measure involves calculating correlations between pixel-shifted versions of the acquired intensity data.

6. The process of claim 1, wherein the computation of the focusing sharpness measures involves calculating correlations between interleaved versions of the acquired intensity data.

* * * * *